United States Patent [19]
Thompson

[11] Patent Number: 5,966,048
[45] Date of Patent: Oct. 12, 1999

[54] LOW IMD AMPLIFICATION METHOD AND APPARATUS

[75] Inventor: James D. Thompson, Manhattan Beach, Calif.

[73] Assignee: Hughes Electronics Corporation, El Segundo, Calif.

[21] Appl. No.: 08/977,724

[22] Filed: Nov. 25, 1997

[51] Int. Cl.[6] ........................................ H03F 3/68
[52] U.S. Cl. ................... 330/124 R; 330/126; 370/480
[58] Field of Search ................. 330/124 R, 126, 330/149, 295; 332/123; 370/480, 481, 483

[56] References Cited

U.S. PATENT DOCUMENTS

| | | | |
|---|---|---|---|
| 4,823,341 | 4/1989 | Rosen | 370/75 |
| 5,302,914 | 4/1994 | Arntz et al. | 330/124 R X |
| 5,675,285 | 10/1997 | Winters | 330/124 R |
| 5,838,675 | 11/1998 | Rauscher | 370/480 X |

OTHER PUBLICATIONS

Linearized transponder technology for satellite communications, Part I: Linearizer Circuit Development and Experimental Characterization, D. Cahana et al, COMSAT Technical Review, vol. 15, No. 2A, Fall 1985, pp. 277–307.

Electronics Engineers' Handbook, Third Edition, Radar, Navigation and Underwater Sound Systems, Fink & Christiansen, pp. 25–60 thru 25–63.

COMSAT Technical Review, vol. 4, No. 2, Fall 1974, The Butler Matrix Transponder, W. A. Sandrin, pp. 319–345.

IEEE Journal of Solid–State Circuits, vol. SC–9, No. 6, Dec. 1974, A Wide–Band Feedforward Amplifier, R. G. Meyer et al, pp. 422–428.

*Primary Examiner*—Steven J. Mottola
*Attorney, Agent, or Firm*—Georgann S. Grunebach; M. W. Sales

[57] ABSTRACT

Amplifier-induced intermodulation distortion (IMD) is reduced by encoding a multi-frequency input composite signal into multiple encoded signals that vary from each other in their power amplitudes as a function of frequency, amplifying the encoded signals, and then decoding them in a complementary fashion so as to differentiate between the amplified signal components and the IMD components. The amplified signal components are coherently combined to separate them from the IMD components, which are incoherently combined. The input signal is preferably encoded by dividng it into multiple divided signals, introducing relative phase shifts between the divided signals that vary as a function of frequency, and combining the divided and phase shifted signals with each other in a Butler matrix prior to amplification. The phase shifts are introduced by means of time delays that are preferably equal to integer multiples of 4Π divided by the input signal bandwidth.

39 Claims, 7 Drawing Sheets

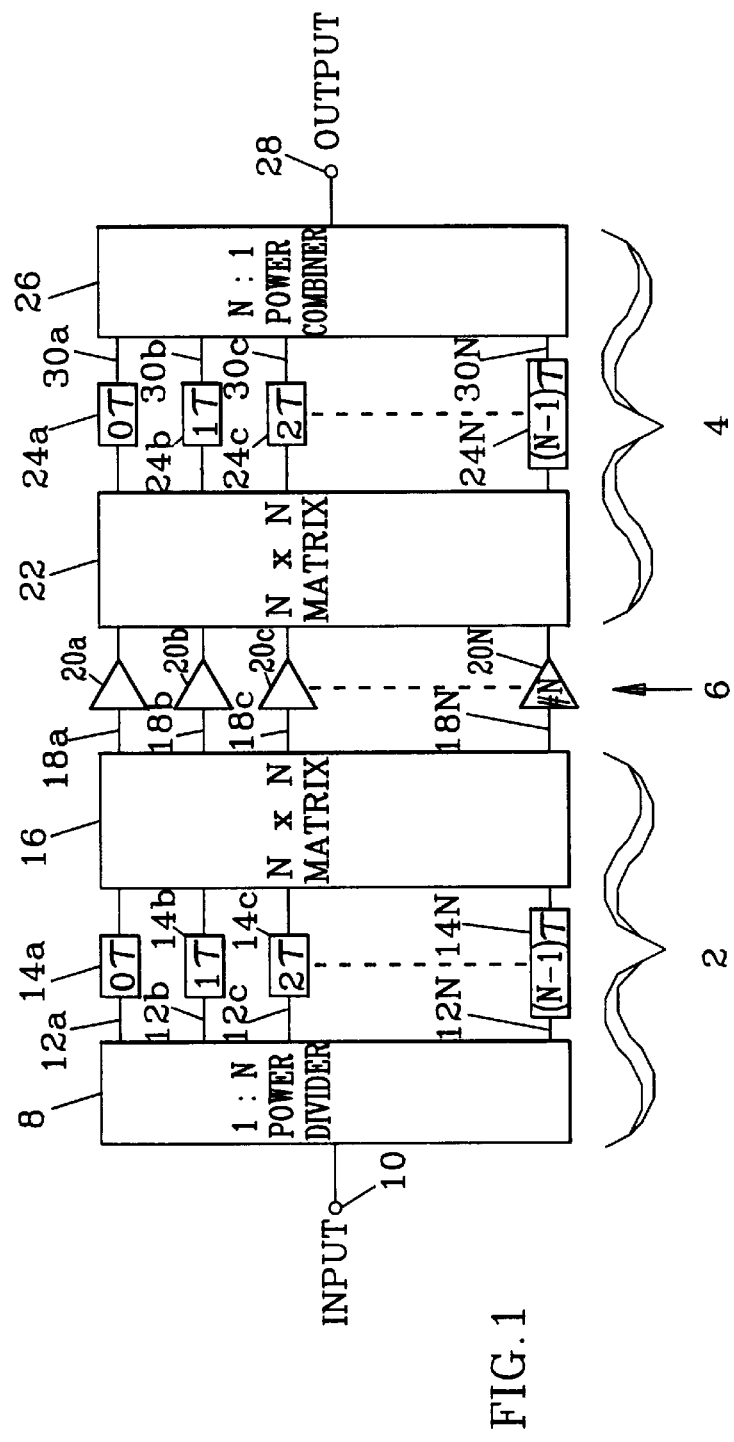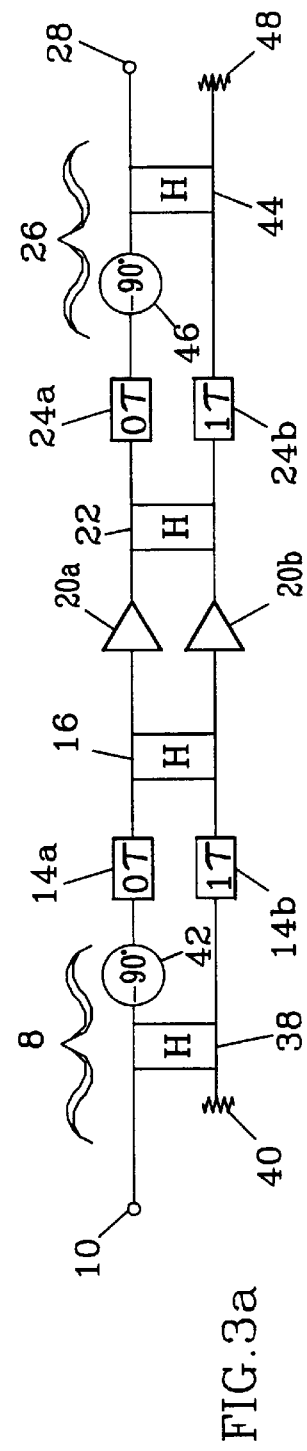
FIG. 1
FIG. 3a

LOW IMD AMPLIFICATION METHOD AND APPARATUS

BACKGROUND OF THE INVENTION

Field of the Invention

This invention in general relates to parallel amplifier systems used to amplify a plurality of signals for transmission, and in particular to a method and apparatus to reduce the level of intermodulation products transmitted in the direction of the desired signals.

Description of the Related Art

Amplifiers used for phased arrays and also in a number of other electronic and electromagnetic applications provide an increase in the power of the signal(s) delivered to the amplifier input. While these amplifiers generally produce higher power replicas of the input signals, they also produce intermodulation products when the input consists of multiple signals. Many of these intermodulation products occur at frequencies at or near those of the desired carriers, and can be an impediment to transmission signal quality. Within a given bandwidth the intermodulation distortion (IMD) is generally characterized by the carrier-to-intermodulation ratio (C/IM).

When an amplifier is operated well below its peak power level the C/IM is generally large and the IMD is low. As the amplifier operating point (output power) is moved closer to its peak value the C/IM degrades rapidly. The normal method of coping with this phenomenon is to reduce the amplifier operating point from its peak power level until the C/IM is within acceptable limits. However, at lower drive levels the amplifier's DC-to-RF efficiency is generally reduced. For some applications such as communications satellites in which DC power is a scarce commodity, this efficiency reduction limits the communications capacity of the satellite. In general it is highly desirable to simultaneously achieve high efficiency and high linearity (C/IM).

For terrestrial applications, reducing the operating point increases the C/IM ratio but the output power is reduced. This effect is overcome by using a higher power amplifier, but amplifier availability and cost can limit the practicality of this approach.

Generally, there are three known techniques to enhance the C/IM performance of such multi-signal amplifiers. The first is a feed forward technique such as that described in Meyer et al., "A Wide-Band Feedforward Amplifier", IEEE *Journal of Solid-State Circuits*, Vol. SC-9, No. 6, Dec. 1974, pages 422–428. This approach offers an improvement in C/IM but at the expense of system complexity and reduced efficiency.

The second technique is the predistortion linearizer approach described in Cahana et al., "Linearized transponder technology for satellite communications", *Comsat Technical Review*, Vol. 15, No. 2A, Fall 1985, pages 277–307. This technique has been used extensively to improve the C/IM performance of amplifiers operated below their peak levels. No significant improvement is achieved at peak power where the efficiency is high.

The third technique is called the Butler Matrix Transponder and is described by W.A. Sandrin in the *Comsat Technical Review*, Vol. 4, No. 2, Fall 1974, pages 319–345. This technique uses a pair of N×N Butler matrices that precede and follow a set of N amplifiers, and a set of filters that follow the output Butler matrix. According to Sandrin the C/IM improvement for a large number of signals at all power levels is approximately $M^2/(2M-1)$, where M is the number of channel filters and is less than or equal to N (the order of the matrices).

SUMMARY OF THE INVENTION

The present invention offers improved C/IM without sacrificing amplifier efficiency, and thus provides improved performance relative to the feed forward and predistortion linearizer techniques. It also offers a larger C/IM improvement than is available with the Butler matrix transponder technique. The invention can be used to amplify a plurality of signals in a single path with less IMD than would otherwise be possible, and to direct the amplified version of the signals on a single path or in a particular spatial direction.

More linear multi-signal amplification is achieved with parallel amplifiers operating between input and output networks such that the signal components combine coherently at the output but the IMD components do not. A composite input signal having different frequency components is encoded in a 3-step process before being applied to a bank of parallel amplifiers. The first step is to divide the composite signal into N equal parts by a 1 to N power divider network. In the second step each part is subjected to a unique differential time delay. The third step consists of routing the parts through a combiner/divider matrix such as an N×N Butler matrix, each output of which includes a contribution from each of the parts input into the matrix. The matrix outputs vary from each other in their spectral amplitude response as a function of frequency. At this point each of the N parts of the processed composite signal is amplified by a respective one of a bank of N amplifiers.

After amplification the N parts are subjected to a decoding process that is complementary to the encoding process. First they are routed through an inverse matrix, then each is subjected to a complementary differential time delay, and finally the N parts are combined in an N-to-1 power combiner.

Since the composite signal is encoded prior to amplification with a complementary decoding after amplification, the N parts combined coherently at the output. IMD products generated in the amplifiers are also complementarily transformed after the amplifiers. However, since they were not encoded by the input transform process, they do not combine coherently at the output. Instead they are distributed among the N output ports of the summing network.

In a first embodiment the summing network is realized as a microwave transmission line network (such as a network of hybrid couplers). All of the output ports, except the signal port, are normally terminated with loads. A significant amount of the IMD power is routed to the loaded ports. The reduction in IMD power routed to the signal output port produces the desired improvement in linearity.

In a second embodiment the summing network is replaced with a phased array that provides coherent summing of the signal components in the desired direction and incoherent summing or scattering of the IMD power in other directions for a significant percentage of the IMD products.

The improvement in C/IM available with the present invention is approximately $N^2/3$, where N is number of parallel amplifiers used.

BRIEF DRSCRIPTION OF THE DRAWINGS

FIG. 1 is a block diagram of an amplification system designed to implement an embodiment of the new amplification method in which the amplified signal components are parated from the IMD components by coherently combining he signal components and incoherently combining the IMD components;

FIG. 3a is a schematic diagram of a two-amplifier implementation of the FIG. 1 embodiment;

FIGS. 3b, 3c and 3d are graphs respectively illustrating the versus frequency, the amplitude response versus frequency and the phase response versus frequency for the amplifiers of FIG. 3a;

DETAILED DESCRIPTION OF THE INVENTION

Figure 2:
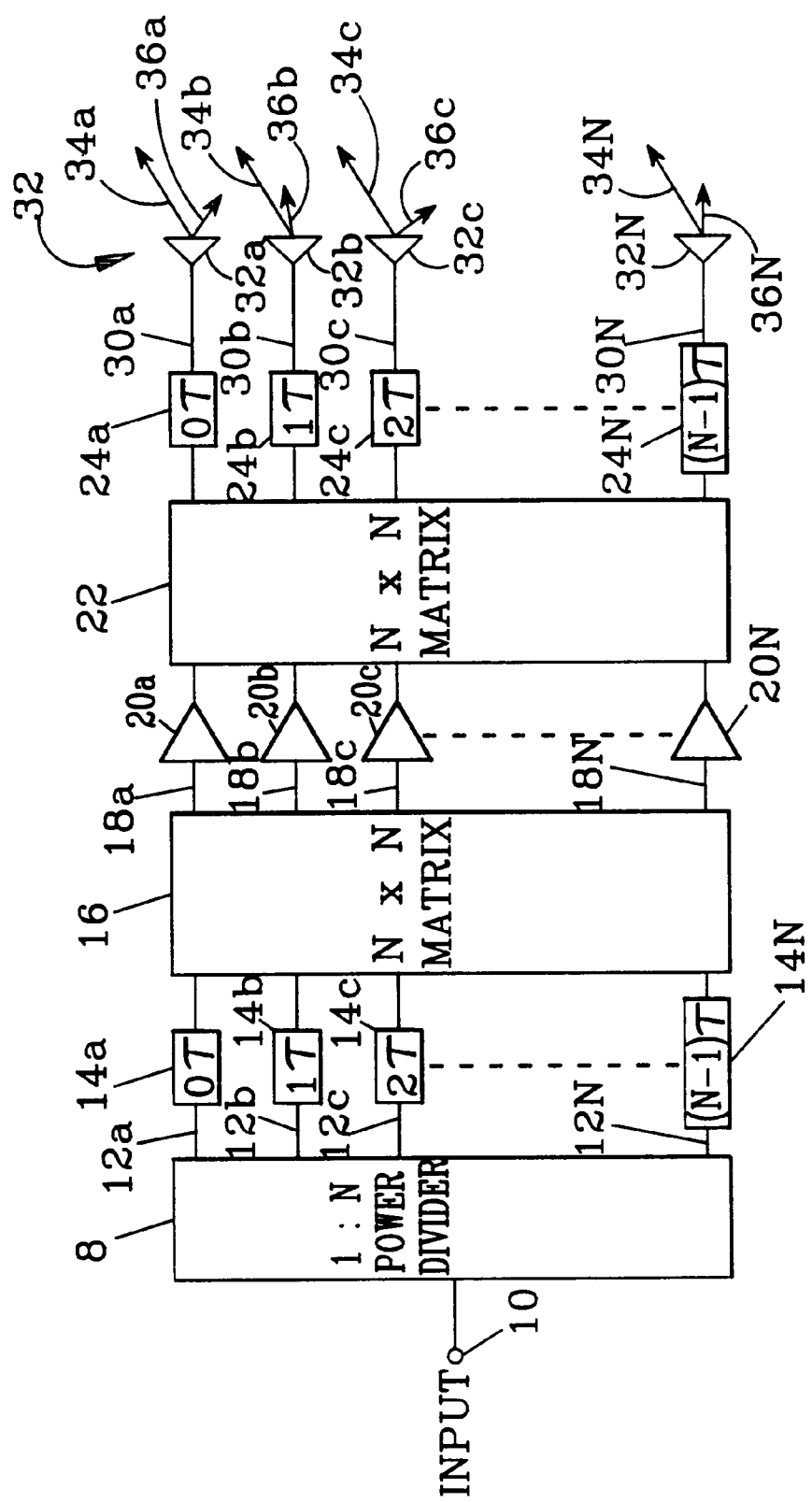
FIG. 2 is a block diagram of another embodiment in which the separation is achieved by transmitting the signal and IMD components at different angles from a phased array.

The present invention is applicable to linear amplifier systems in general, such as (but not limited to) microwave repeaters and satellite relays.

The general approach taken by the invention to reduce IMD products in the amplified output is to encode the composite input signal into multiple signals that vary from each other in their amplitudes as a function of frequency, amplify the encoded signals, and decode the amplified signals in a complementary manner that reverses the encoding process and thereby restores the original composite input signal in an amplified form. IMD products are differentiated from the desired output signal because such products undergo the decoding but not the encoding process. A block diagram of one implementation of the invention is shown in FIG. 1, with the encoder section identified by reference number 2, the decoder section by number 4 and the amplifier section by number 6.

In a preferred embodiment, a 1:N power divider 8 divides a multi-frequency input signal at an input terminal 10 into N divided signals on divider output lines 12a, 12b, 12c, . . . 12N. The divided signals can be equal in power to each other, or they can have different power level and a complementary power combiner in the decode section weighted so as to restore the original signal waveform.

The divided signals are subjected to respective time delays 14a, 14b, 14c, . . . 14N that introduce relative phase shifts between the divided signals that vary as a function of frequency. As a result, the divided signals vary from each other in both their power amplitudes as a function frequency, and in their phase distributions. Since each divided signal carries multiple frequencies over the input signal waveband, a time delay applied to a given divided signal will produce a phase shift which is a function of frequency over the bandwidth of interest.

In the FIG. 1 illustration, the first divided signal on line 12a is not delayed, while the divided signals on the remaining lines 12b, 12c, . . . 12N are subjected to time delays that increase linearly in increments of $\tau$, with the signal on line 12b delayed by $1\tau$, the signal on line 12c by $2\tau$, and so on to the signal on line 12N, which is delayed by $(N-1)\tau$. $\tau$ is preferably a constant so that the phase delay for each divided input signal varies linearly as a function of frequency, although a system could also be implemented in which $\tau$ varied as a function of frequency. Similarly, the time delay for each successive divided signal is preferably increased by a constant increment, although a system could also be implemented in which the difference in time delays between successive divided signals varied from one signal to the next. While theoretically many different values of $\tau$ could be selected, optimum results have been obtained when $\tau$ is an integer multiple of $4\Pi$ divided by the bandwidth of the composite input signal. The results are optimum in that the improvement in IM level is least sensitive to amplitude and phase imbalance among the amplifiers.

The delayed divided signals are applied as inputs to an NxN matrix 16, preferably implemented as a hybrid coupler Butler matrix, which distributes its inputs so that each of its N outputs on output lines 18a, 18b, 18c, . . . 18N includes contributions from each of the different matrix inputs. Butler matrices are well known and are described, for example, in *Electronics Engineers' Handbook*, Fink and Christiansen, ed., Third Edition 1989, pages 25-61–25-62.

The encoded matrix outputs are applied to respective power amplifiers 20a, 20b, 20c, . . . 20N, which are typically solid state power amplifiers (SSPAs) or traveling wave tube amplifiers (TWTAs) for satellite applications, but in general may be any power amplifiers that introduce IMD in response to a multi-frequency input.

The decoder section 4 consists of an inverse NxN matrix 22, again preferably a hybrid coupler Butler matrix, a series of time delays 24a, 24b, 24c, . . . 24N at the matrix outputs with respective delays equal to those of 14a, 14b, 14c, . . . 14N, and an N:1 power combiner 26 that combines the signals from the time delays 24a . . . 24N into a single output at terminal 28. The decoding matrix 22, time delays 24a-24N and power combiner 26 are arranged in reverse order to the corresponding encoding elements 8, 14a-14N and 16, and act upon the amplifier outputs in a complementary fashion that restores the original input signal in amplified form at output terminal 28. The manner in which the matrices operate to produce this signal restoration is described in further detail below in connection with FIG. 3a. The power combiner 26 can be a conventional microwave transmission line network implemented by a network of hydrid couplers, with all of the combiner outputs except the signal port terminated with loads.

The amplifiers 20a–20N introduce IMD into the signal components which they amplify. Since the output of the encoding power divider 8 are mutually coherent (in phase with each other) and the encoding time delays 14a–14N and matrix 16 are the complements of the decoding matrix 22 and time delays 24a–24N, the signal components from the input lines 30a, 30b, 30c, . . . 30N to the power combiner 26 will also be mutually coherent and will combine in a coherent additive fashion to reproduce the original input signal (in amplified form) at the output terminal 28. However, the IMD components introduced by the amplifiers are different for each of the amplifiers because the amplified inputs are different, and the IMD components at the inputs to the power combiner 26 will be decorrelated and mutually incoherent because they experience only the decoding but not the encoding process. Even after the decoding delay and combining operations, the two IMDs components remain largely uncorrelated and add approximately on a power basis. The desired signal components, however, combine coherently and add on a voltage basis. Accordingly, the IMD components do not coherently combine in the power combiner 26 and a much smaller level of IMD is passed to the output terminal 28 than would otherwise be the case. The power combiner 26 thus effectively separates the decoded amplified signal components from the decoded IMD components by coherently combining the signal components but incoherently combining the IMD components. Only a portion of the IMD arrives at the output 28. The remaining IMD power is routed to the load or loads internal to the power combiner 26.

FIG. 2 illustrates an alternate embodiment in which the amplified input signal is broadcast from a multi element array antenna rather than being applied to an output transmission line. In this embodiment the antenna performs the function of a power combiner that separates the amplified and decoded signal components from the IMD components.

Except for the decoder power combiner 26, the circuit of FIG. 2 is identical to that of FIG. 1. The power combiner 26 in FIG. 1 is replaced with a phased array 32 that consists of radiating antenna elements 32a, 32b, 32c, . . . 32N, each fed by respective decoder time delay output lines 30a, 30b, 30c, . . . 30N. The array provides coherent summing of the signal components in a desired direction, and incoherent summing or scattering of the IMD product power in other directions for a significant percentage of the IMD products. The radiated signal components 34a, 34b, 34c, . . . 34N are parallel to each other and thus additive. A radiated signal direction that is non-perpendicular to the array, as illustrated in FIG. 2, can be achieved by introducing phase differences between the decoded output signals. The IMD components 36a, 36b, 36c, . . . 36N are scattered from the array at different directions that prevent them from summing as efficiently as the desired signal.

A two amplifier implementation of the FIG. 1 system which uses the new linearization technique is illustrated in FIG. 3a. The power divider 8 is implemented by a 3dB hybrid coupler 38 having one input connected to the input terminal 10 and its other input to a load 40, together with a −90° phase shifter 42 in the upper output leg of the hybrid coupler. A signal appearing at the upper input leg of a hybrid coupler will be divided between the upper and lower output legs, with the signal on the upper output leg in-phase with the input signal and the signal on the lower output leg shifted −90° from the input signal. (Similarly, an input signal applied to the lower input leg is divided between the two output legs, with the lower output leg inphase and the upper output leg shifted −90° with respect to the input on the lower leg.) The phase shifter 42 causes the signals on both output legs of the coupler to be equal in amplitude and in-phase with each other.

The signal on the lower output leg is delayed $\tau$ seconds by delay 14b before both legs are applied to the 2×2 Butler matrix 16, which divides and combines the direct and delayed versions of the input signal and provides drives to the amplifier pair 20a and 20b. The next hybrid coupler 22, which is also a Butler matrix, reconstructs the amplified input signal and its delayed counterpart, with the delayed direct signal on the lower output leg of the Butler matrix 22 and its delayed counterpart on the upper output leg. Thus, the input signal at the upper input leg of the encoding Butler matrix 16 appears in amplified form on the lower output leg of the decoding Butler matrix 22. This is because the signal at the upper input leg of Butler matrix 16 is divided into an in-phase component on the upper output leg of 16, and a −90° shifted component on the lower output leg of 16. The in-phase component on the upper output leg is divided (after amplification) into another inphase component on the upper output leg of Butler matrix 22, and a −90° shifted component on the lower output leg of 22. The −90° signal on the lower output leg of encoding Butler matrix 16 is divided (again after amplification) into a −180° shifted component on the upper output leg of decoding Butler matrix 22 and a −90° component on the lower output leg of 22. The in-phase and −180° signal components on the upper output leg of Butler matrix 22 cancel each other, while the two −90° signal components on the lower output leg of 22 add together to restore the original input signal at the upper input leg of Butler matrix 16 (subject to a −90° phase shift). Similarly, the signal on the lower input leg of Butler matrix 16 will appear in amplified form on the upper output leg of decoding Butler matrix 22.

The decoding section's power combiner is implemented by another hybrid coupler 44 which has its upper input leg connected through a −90° phase shifter 46 to the output of 0$\tau$ time delay 24a, its lower input leg connected directly to the output of 1$\tau$ time delay 24b, its upper output leg connected to the output terminal 28 and its lower output leg to a terminating load 48. The encoding and decoding sections are thus completely complementary, with the undelayed signal at the upper input leg of encoding Butler matrix 16 receiving a 1$\tau$ delay in the decoding section, and the 1$\tau$ delayed signal at the input to encoding Butler matrix 16 receiving a 0$\tau$ delay at the upper output leg of decoding Butler matrix 22. The signals on the upper and lower decoding time delay outputs are aligned in time, with the signal components coherently combined in the power combiner 26 to yield an amplified output signal at terminal 28, and the IMD components removed from the system through load 48. The described arrangement provides amplification of the input signal and up to approximately 2 dB improvement in the C/IM ratio relative to the C/IM of the individual amplifiers.

Figure 3B:
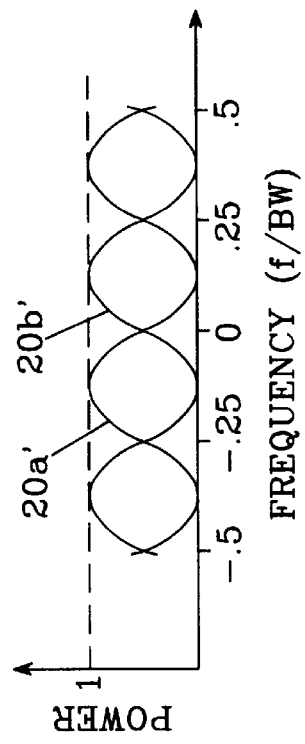

FIG. 3b illustrates the normalized power spectral distribution for the two-amplifier system of FIG. 3a, with the power amplitudes in amplifiers 20a and 20b illustrated by curves 20a' and 20b', respectively, as a function of frequency. The two curves are generally sinusoidal and 180° out of phase, with one amplifier reaching a peak power amplitude at a frequency at which the power amplitude of the other amplifier is at a minimum, and vice versa. The portion of the illustrated power spectral distribution that lies within the system's bandwidth is a function of the time delay $\tau$, with a small value of $\tau$ resulting in a larger bandwidth and vice versa.

Figure 3C:
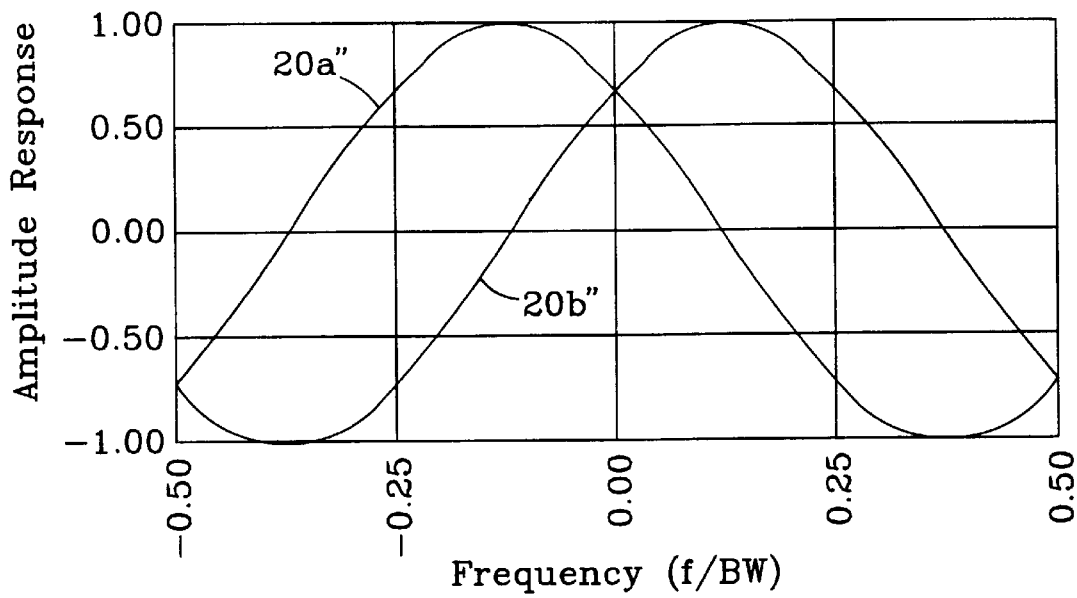
Figure 3D:
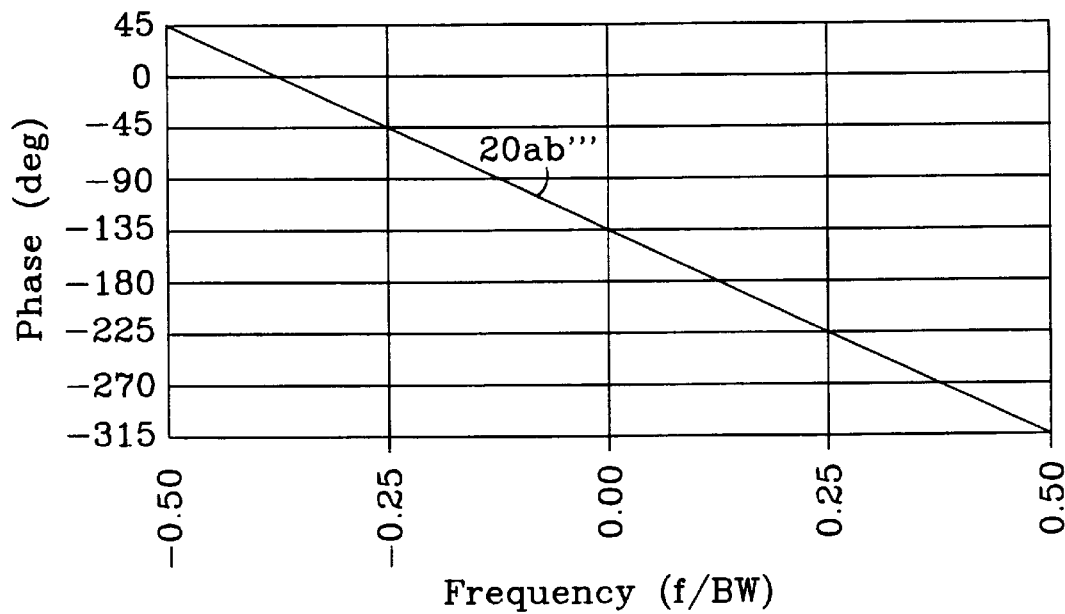

FIG. 3b illustrates the respective normalized signal amplitude responses 20a" and 20b" of amplifiers 20a and 20b, showing them to be generally sinusoidal and 90° out of phase, with one amplifier reaching a peak amplitude when the other amplifier is at zero amplitude. In FIG. 3c the signal phase 20a,b'" as a function of frequency for both amplifiers 20a and 20b is shown to follow a straight line 45 at the lower end of the bandwidth, through −135° at the center frequency, to −315° at the upper end of the bandwidth.

Figure 4:
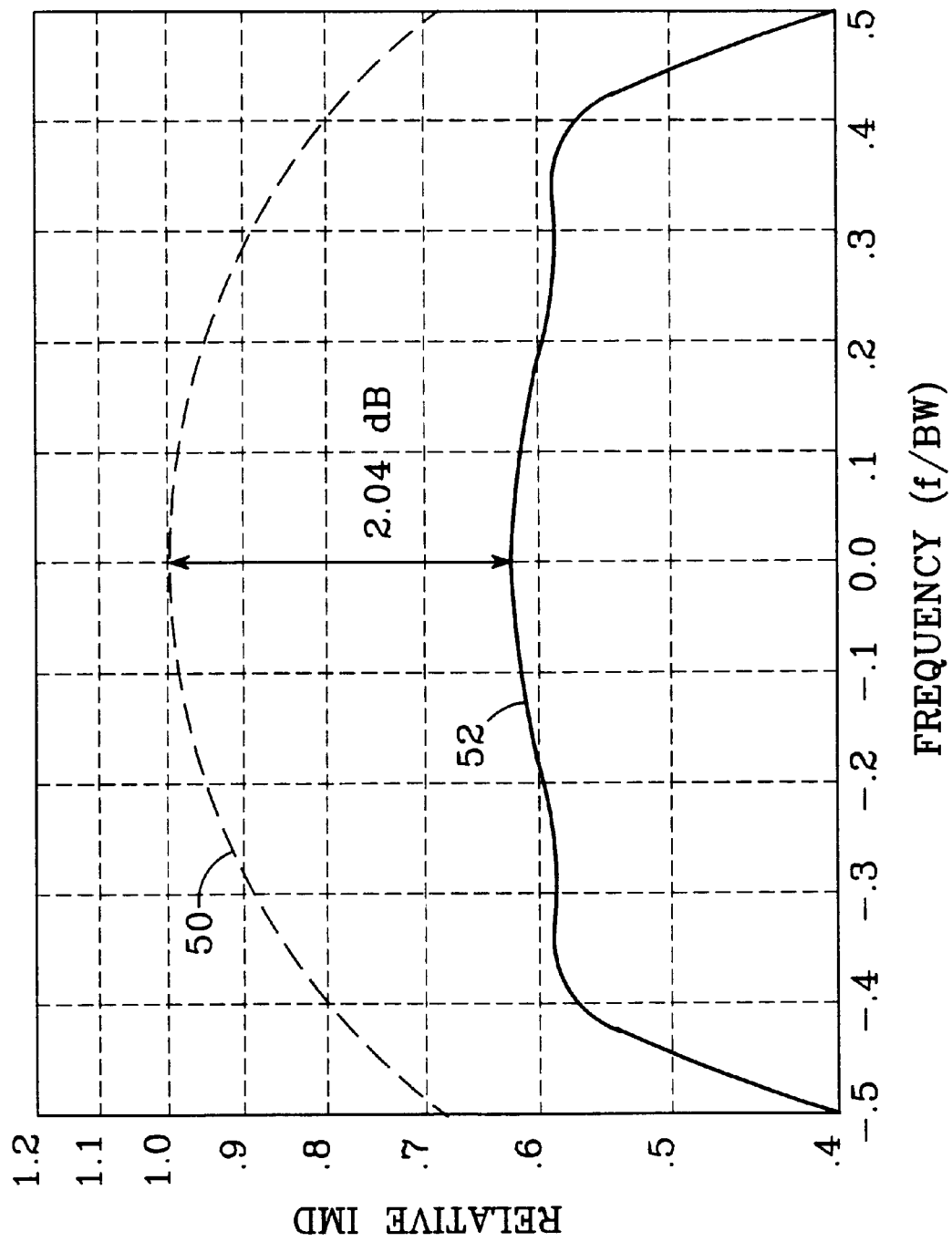
FIG. 4 is a graph comparing IMD levels, with and without the invention, as a function of frequency.

A simulation of the network properties for the amplification system of FIG. 3a indicates that the relative improvement in IMD is 2.04 dB at the center of the frequency band of interest. This level of improvement occurs when the value of $\tau$ is selected to provide 4Π radians of phase shift across the bandwidth of interest. The improvement achieved under this condition is illustrated in FIG. 4, in which the IMD level achieved with unimproved amplification is indicated by dashed line 50, and the improved level resulting from the invention by solid line 52. With $\tau$ equal to 4Π radians divided by the bandwidth of interest, the band center improvement is 2.04 dB and the improved IMD spectrum 52 is relatively flat across the band. The IMD improvement occurs because the decorrelated IMD products are routed to the terminated output port of the network.

Figure 5:
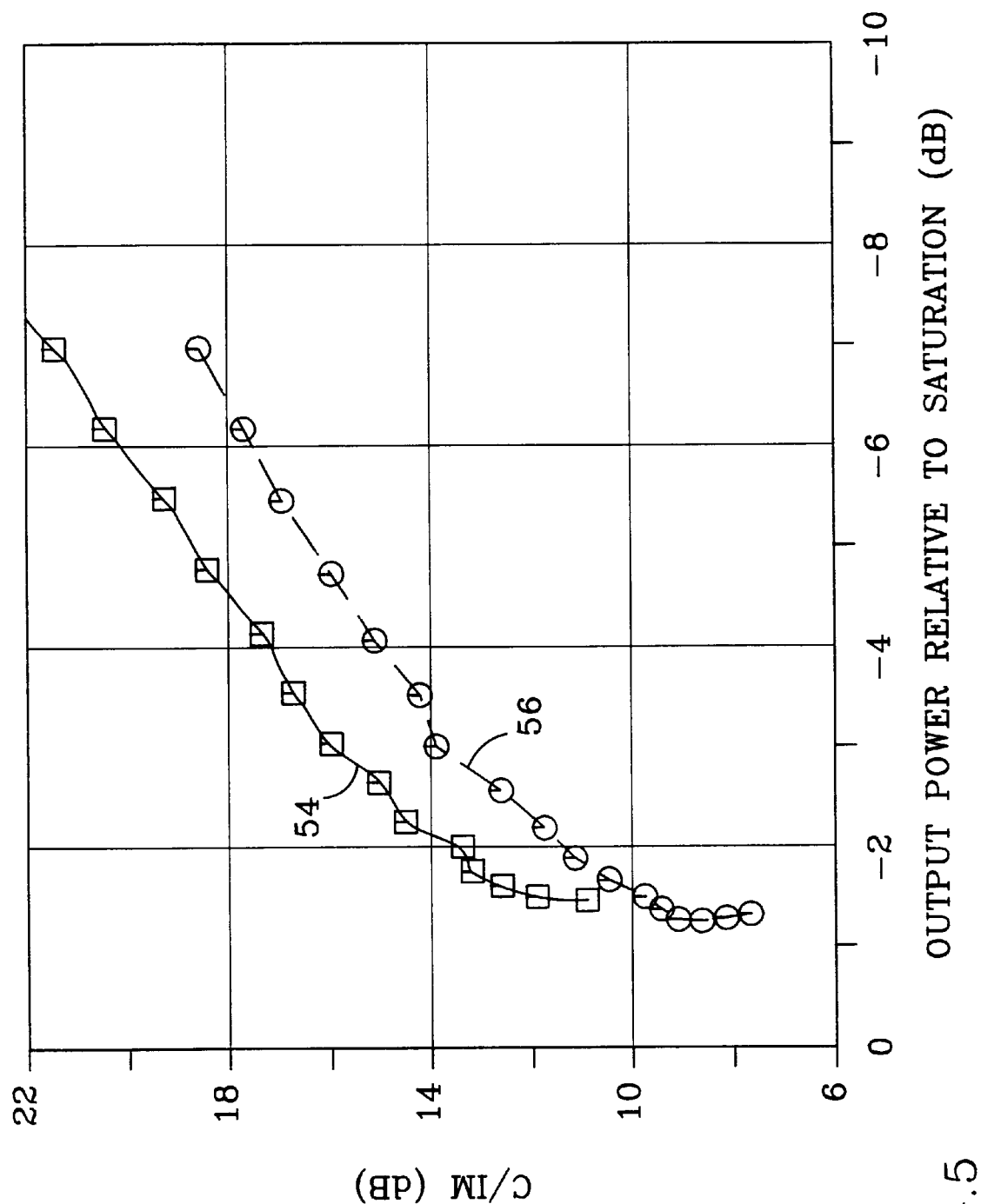
FIG. 5 is a graph comparing C/IM ratios, with and without the invention, as a function of amplifier output backoff from peak output.

The network shown in FIG. 3a was also evaluated by computer simulation for a pair of TWTs to verify the expected performance improvement. The 2 dB improvement was obtained when the time delay was selected to correspond to 4Π radians of phase shift across the signal bandwidth. This C/IM improvement holds over a wide range of input signal drive levels as shown in FIG. 5, in which the simulated results with the invention are indicated by upper solid line 54, and the results without the invention by lower dashed line 56. The simulation was performed for the case of an infinite number of input carriers (white noise) for which the C/IM-related parameter is the noise power ratio (NPR).

The improvement in C/IM with the new technique is obtained as a result of the properties of the network operating upon the signals and IMD products, and is therefore independent of the type of amplifier used. Thus, each amplifier could consist of a TWT and a predistortion linearizer. The network would still provide an approximately 2 dB improvement over and above that provided by the linearizer. In general, the new technique can be used in conjunction with linearizers to realize compound improvements in C/IM.

Figure 6:
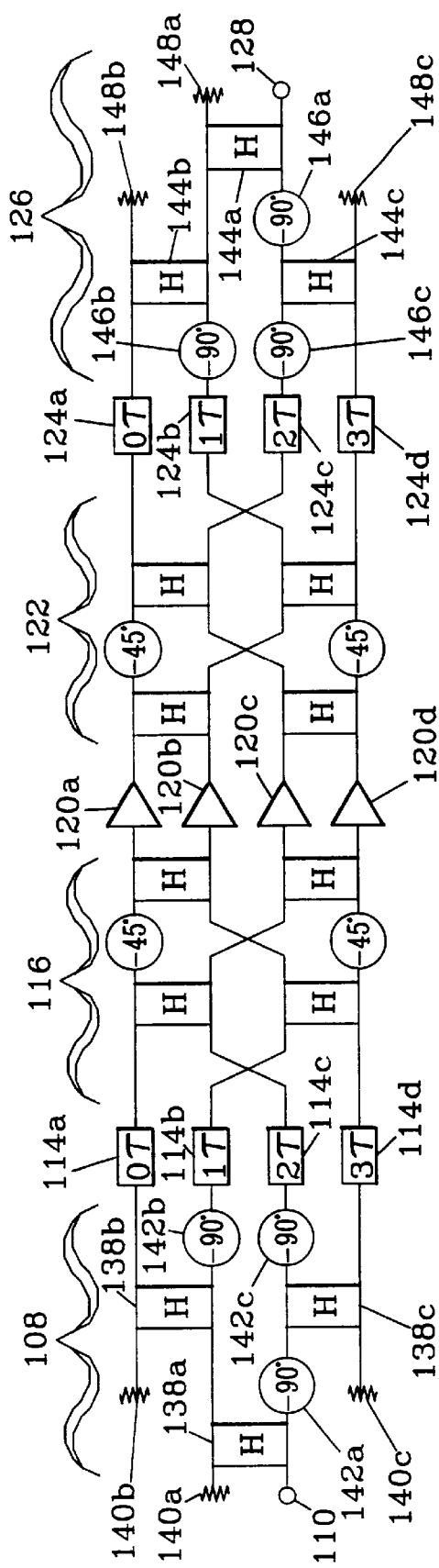
FIG. 6 is a schematic diagram of a four-amplifier implementation of the FIG. 1 embodiment.

The invention can be extended to larger order groupings of amplifiers to obtain even greater C/IM improvement. FIG. 6 shows a network with four hybrid-coupled parallel amplifiers with appropriate time delays. FIG. 6 generally corresponds to FIG. 3a, except FIG. 6 uses four amplifiers and time delays instead of two, and 4×4 hybrid coupler matrices rather than 2×2 matrices. The reference numbers used in FIG. 3a are carried over to FIG. 6 and incremented by 100, so that for example the encoding power divider 108 in FIG. 6 corresponds to power divider 8 in FIG. 3a. The encoding power divider 108 is formed by three hybrid couplers 138a, 138b, 138c and phase shifters 142a, 142b, 142c that form a four-way power division network with equal phase in each leg. The next stage of the network consists of the progressive time delays 114a, 114b, 114c, 114d in each leg that have time delays equal to integer multiples of τ, beginning with 0. A fourth order Butler matrix 116 then routes a portion of the signal in each leg to each of the four amplifiers 120a, 120b, 120c, 120d. The decoding section after the amplifiers is the mirror image of the encoding section and includes fourth order Butler matrix 122, 0τ, 1τ, 2τ and 3τ time delays 124a, 124b, 124c, 124d, and a four-way power combiner 126 consisting of three hybrid couplers 144a, 144b, 144c and three −90° phase shifters 146a, 146b, 146c.

The performance of the four-amplifier configuration was determined analytically for both a discrete and an infinite number of carriers. The C/IM improvement was determined to be about 7 dB for 25 equal carriers. This improvement approached 7.43 dB as the number of carriers was increased to infinite. These results were obtained with a value of τ corresponding to 4Π radians of phase shift across the bandwidth.

Figure 7:
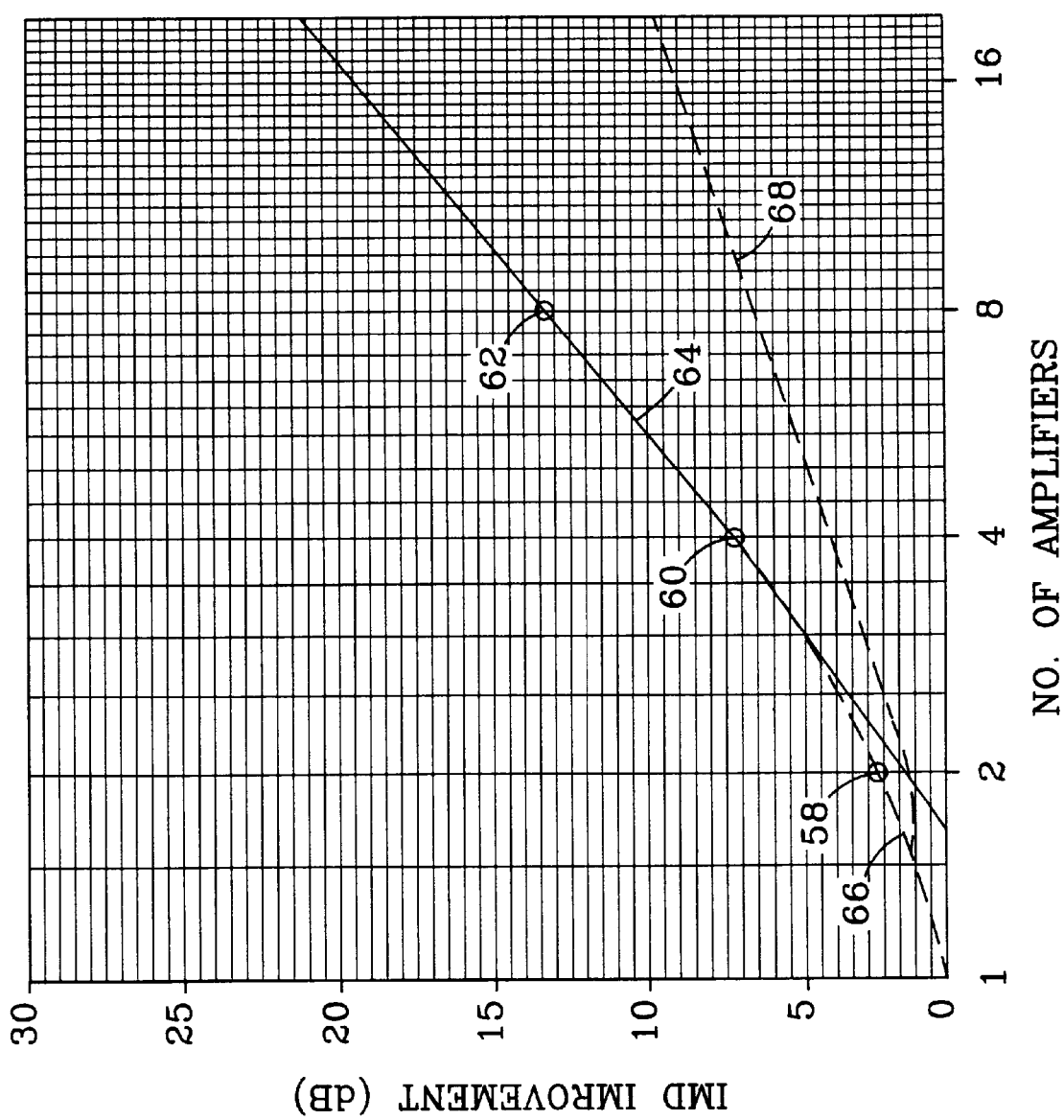
FIG. 7 is a graph of the improvement in IMD as a function of the number of amplifiers used.

The invention is applicable to larger numbers of amplifiers with an even greater degree of C/IM improvement. FIG. 7 shows the calculated mid-band IMD improvement available for amplifier groupings of 2, 4 and 8. The three data points are indicated by circles 58, 60 and 62. These points are approximated by the function $10\log(N^2/3)$, which is indicated by solid line 64. The dashed line 66 which diverges somewhat from line 64 below the four amplifier point is a curve which connects the actual data points. For reference, the improvement obtained with the prior Butler matrix transponder technique mentioned previously is indicated by dashed line 68.

While particular embodiments of the invention have been shown and described, numerous variations and alternate embodiments can be made within the scope of the invention. For example, while the invention has been described in terms of analog components, the various functional blocks indicated in FIGS. 1 and 2 could also be implemented digitally. Accordingly, it is intended that the invention be limited only in terms of the appended claims.

I claim:

1. A signal amplification method, comprising:

encoding a multi-frequency input signal into N encoded signals by (a) power dividing the input signal into N power divided signals (b) subjecting each of said power divided signals to respective time delays, and (c) matrixing the resulting time delayed power divided signals to obtain said N encoded signals, with each of the encoded signals including contributions from each of said N time delayed power divided signals, amplifying said encoded signals, and in the amplification process generating and adding undesired intermodulation distortion (IMD) components to signal components of said encoded signals, and decoding the amplified signals and IMD components in a manner complementary to said encoding to differentiate the amplified signal components from the IMD components, with the amplified signal components representing both said encoding and decoding but the IMD components representing only said decoding.

2. A signal amplification method comprising:

encoding a multi-frequency input signal into multiple encoded signals that vary from each other in their power amplitudes as a function of frequency, amplifying said encoded signals, and in the amplification process generating and adding undesired intermodulation distortion (IMD) components to signal components of said encoded signals, and decoding the amplified signal and IMD components in a manner complementary to said encoding to differentiate the amplified signal components from the IMD components, wherein said decoded amplified signal components are separated from said decoded IMD components by coherently combining the amplified signal components and incoherently combining the decoded IMD components, with the amplified signal components representing both said encoding and decoding but the IMD components representing only said decoding.

3. A signal amplification method, comprising:

encoding a multi-frequency input signal into multiple encoded signals that vary from each other in their power amplitudes as a function of frequency, amplifying said encoded signals, and in the amplification process generating and adding undesired intermodulation distortion (IMD) components to signal components of said encoded signals, and decoding the amplified signal and IMD components in a manner complementary to said encoding to differentiate the amplified signal components from the IMD components, wherein said decoded amplified signal components are separated from said decoded IMD components by transmitting said decoded amplified signal components and at least a portion of the decoded IMD components at different angles from a phased array, with the amplified signal components representing both said encoding and decoding but the IMD components representing only said decoding.

4. A signal amplification method comprising:

encoding a multi-frequency input signal into multiple encoded signals that vary from each other in their power amplitudes as a function of frequency, wherein said input signal is encoded by dividing it into multiple divided signals, applying different respective time delays to said divided signals, and combining said divided signals with each other to obtain said encoded signals, amplifying said encoded signals, and in the amplification process generating and adding undesired intermodulation distortion (IMD) components to signal components of said encoded signals, and decoding the amplified signal and IMP components in a manner complementary to said encoding to differentiate the amplified signal components from the IMD components, with the amplified signal components representing both said encoding and decoding but the IMD components representing only said decoding.

5. The method of claim 4, wherein said divided signals are combined with each other in a Butler matrix.

6. The method of claim 4, wherein a zero time delay is applied to one of said divided signals.

7. The method of claim 4, wherein said time delays produce phase delays in the delayed signals that are linear functions of frequency.

8. The method of claim 4, wherein said time delays are integer multiples of 4Π divided by the input signal bandwidth.

9. The method of claim 1, wherein said encoding is performed digitally.

10. A signal amplification method, comprising:

encoding an input signal by:
dividing the input signal into multiple divided signals, introducing relative phase shifts between said divided signals that vary as a function of frequency, and combining said divided signals with each other after said relative phase shifting to produce multiple combined signals, with each combined signal including a contribution from each of said divided signals, amplifying said combined signals and in the amplification process generating and adding undesired intermodulation distortion (IMD) components to signal components of said combined signals, and decoding the amplified signal and IMD components in a manner complementary to said encoding to differentiate the amplified signal components from the IMD components, with the amplified signal components representing both said encoding and decoding but the IMD components representing only said decoding.

11. The method of claim 10, wherein said decoded amplified signal components are separated from said decoded IMD components by coherently combining the amplified signal components and incoherently combining at least some of the decoded IMD components.

12. The method of claim 10, wherein said decoded amplified signal components are separated from said decoded IMD components by transmitting said decoded amplified signal components and at least some of the decoded IMD components at different angles from a phased array.

13. The method of claim 10, wherein said divided signals are combined with each other in a Butler matrix.

14. The method of claim 10, wherein said relative phase shift are introduced between said divided signals by applying different respective time delays to said divided signals.

15. The method of claim 14, wherein a zero time delay is applied to one of said divided signals.

16. The method of claim 14, wherein said time delays produce phase delays in the delayed signals that are linear functions of frequency.

17. The method of claim 14, wherein said time delays are integer multiples of 4n divided by the input signal bandwidth.

18. The method of claim 10, wherein said encoding and decoding are performed digitally.

19. A low intermodulation distortion (IMD) signal amplification system, comprising:

a signal encoder arranged to encode a multi-frequency input signal into N encoded signals, said signal encoder comprising:
a power divider connected to divide the input signal into N power divided signals,
a time delay network connected to subject each of said power divided signals to respective time delays, and
a matrix connected to receive time delaved power divided signals from said time delay network and to matrix them into N encoded signals which each include contributions from each of said time delayed power divided signals, an amplifier circuit connected to amplify said encoded signals, said amplifier circuit introducing IMD components to signal components of said encoded signals, and a signal decoder arranged to decode the amplified signal components and the IMD components in a manner complementary to said encoding to differentiate the amplified signal components from the IMD components, with the amplified signal components representing both said encoding and decoding but the IMD components representing only said decoding.

20. A low intermodulation distortion (IMD) signal amplification system, comprising:

a signal encoder arranged to encode a multi-frequency composite input sional into multiple encoded signals that vary from each other in their power amplitudes as a function of frequency, an amplifier circuit connected to amplify said encoded signals, said amplifier circuit introducing IMD components to signal components of said encoded signals, and a signal decoder arranged to decode the amplified signal components and the IMD components in a manner complementary to said encoding to differentiate the amplified signal components from the IMD components, with the amplified signal components representing both said encoding and decoding but the IMD components representing only said decoding, said signal decoder including a signal separator connected to separate the decoded amplified signal components from at least some of the decoded IMD components based upon said differentiation.

21. The amplification system of claim 20, wherein said signal separator comprises a signal combiner that separates said decoded amplified signal components from said decoded IMD components by coherently combining the decoded amplified signal components and incoherently combining at least some of the decoded IMD components.

22. The amplification system of claim 20, wherein said signal separator comprises a phased array that separates said decoded amplified signal components from said decoded IMD components by transmitting the decoded amplified signal components and at least some of the decoded IMD components at different angles.

23. A low intermodulation distortion (IMD) signal amplification system, comprising:

a signal encoder arranged to encode a multi-frequency composite input signal into multiple encoded signals that vary from each other in their power amplitudes as a function of frequency, said signal encoder comprising a signal divider that divides said input signal into multiple divided signals, a time delay portion that applies different respective time delays to said divided signals, and a combiner network that combines said divided signals with each other to obtain said encoded signals, an amplifier circuit connected to amplify said encoded signals, said amplifier circuit introducing IMD components to signal components of said encoded signals, and a signal decoder arranged to decode the amplified signal components and the IMD components in a manner complementary to said encoding to differentiate the amplified signal components from the IMD components, with the amplified signal components representing both said encoding and decoding but the IMD components representing only said decoding.

24. The amplification system of claim 23, wherein said combiner network comprises a Butler matrix.

25. The amplification system of claim 23, wherein said time delay portion applies a zero time delay to one of said divided signals.

26. The amplification system of claim 23, wherein said time delay portion applies time delays to said divided signals that produce phase delays in the delayed signals that are linear functions of frequency.

27. The amplification system of claim 23, wherein said time delay portion applies time delays to said divided signals that are integer multiples of 4Π divided by the input signal bandwidth.

28. The amplification system of claim 19, wherein said encoder operates digitally.

29. The amplification system of claim 19, wherein said amplifier circuit comprises a plurality of amplifiers connected to amplify respective ones of said encoded signals.

30. A low intermodulation distortion (IMD) signal amplification system, comprising:

an input signal encoder that includes:
  a divider that divides an input signal into multiple divided signals,
  a phase shifter that introduces relative phase shifts between said divided signals that vary as a function of frequency, and
  a combiner that combines said divided signals with each other after said relative phase shifting to produce multiple mixed signals that each include a contribution from each of said divided signals, an amplifier circuit connected to amplify said mixed signals, said amplifier circuit introducing IMD components to signal components of said combined signals, and a signal decoder arranged to decode the amplified signal and IMD components in a manner complementary to said encoding to differentiate the amplified signal components from the IMD components, with the amplified signal components representing both said encoding and decoding but the IMD components representing only said decoding.

31. The amplification system of claim 30, said signal decoder including a signal separator connected to separate the decoded amplified signal components from at least a portion of the decoded IMD components based upon said differentiation.

32. The amplification system of claim 31, wherein said signal separator comprises a signal combiner that separates said decoded amplified signal components from said decoded IMD components by coherently combining the decoded amplified signal components and incoherently combining at least some of the decoded IMD components.

33. The amplification system of claim 31, wherein said signal separator comprises a phased array that separates said decoded amplified signal components from said decoded IMD components by transmitting the decoded amplified signal components and at least some of the decoded IMD components at different angles.

34. The amplification system of claim 30, wherein said combiner comprises a Butler matrix.

35. The amplification system of claim 30, wherein said time delay applies a zero time delay to one of said divided signals.

36. The amplification system of claim 30, wherein said time delay applies time delays to said divided signals that produce phase delays in the delayed signals that are linear functions of frequency.

37. The amplification system of claim 30, wherein said time delay applies time delays to said divided signals that are integer multiples of 4Π divided by the input signal bandwidth.

38. The amplification system of claim 30, wherein said encoder operates digitally.

39. The amplification system of claim 30, wherein said amplifier circuit comprises a plurality of amplifiers connected to amplify respective ones of said encoded signals.

* * * * *